(12) United States Patent
Swaroop et al.

(10) Patent No.: US 10,695,857 B2
(45) Date of Patent: Jun. 30, 2020

(54) TOPOLOGY-BASED SPOT WELD OPTIMIZATION WITH INTER-DISTANCE CONSTRAINTS

(71) Applicant: GM GLOBAL TECHNOLOGY OPERATIONS LLC, Detroit, MI (US)

(72) Inventors: Kshitiz Swaroop, Delhi (IN); Varun Agarwal, Karnataka (IN); Biswajit Tripathy, Karnataka (IN)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 393 days.

(21) Appl. No.: 15/723,679

(22) Filed: Oct. 3, 2017

(65) Prior Publication Data
US 2019/0099823 A1 Apr. 4, 2019

(51) Int. Cl.
| | | |
|---|---|---|
| G06F 30/337 | (2020.01) | |
| B23K 9/095 | (2006.01) | |
| G05B 19/418 | (2006.01) | |
| B23K 11/11 | (2006.01) | |
| B23K 11/25 | (2006.01) | |
| B23K 11/24 | (2006.01) | |
| B23K 31/12 | (2006.01) | |
| B23K 101/00 | (2006.01) | |

(52) U.S. Cl.
CPC .......... *B23K 9/0953* (2013.01); *B23K 11/11* (2013.01); *B23K 11/24* (2013.01); *B23K 11/25* (2013.01); *B23K 31/125* (2013.01); *G05B 19/41885* (2013.01); *B23K 2101/006* (2018.08); *G05B 2219/32015* (2013.01); *G05B 2219/45135* (2013.01); *G06F 30/337* (2020.01)

(58) Field of Classification Search
CPC ...... B23K 9/0953; B23K 11/24; B23K 11/25; G06F 30/337
USPC ................................. 703/2; 700/103; 156/64
See application file for complete search history.

(56) References Cited

U.S. PATENT DOCUMENTS

| | | | | |
|---|---|---|---|---|
| 2003/0229476 A1* | 12/2003 | Naganarayana | ....... | G05B 17/02 703/1 |
| 2004/0026007 A1* | 2/2004 | Hubert | ...................... | B82B 3/00 156/64 |
| 2010/0023150 A1* | 1/2010 | Cai | ......................... | B23K 11/11 700/103 |

(Continued)

*Primary Examiner* — Thai Q Phan
(74) *Attorney, Agent, or Firm* — Cantor Colburn LLP

(57) ABSTRACT

A computer-implemented method for reducing spot welds in a parameterized workpiece model includes generating a new design space (DS) from an original spot weld DS. The new DS includes a plurality of spot weld locations from the parameterized workpiece model with the original spot weld DS. The new DS is optimized to have a fewer number of spot weld locations than the original DS. The processor identifies a plurality of offending spot weld locations of the remaining spot weld locations in the new DS and a plurality of conforming spot weld locations of the remaining spot weld locations. The processor removes all but one optimized extension candidate from processor-selected groupings of welds while enforcing a minimum distance requirement. The processor outputs an inter-distance constrained parameterized workpiece model with an optimized extension candidate in each of the plurality of extended DSs to an operatively connected output processor.

10 Claims, 3 Drawing Sheets

(56) References Cited

U.S. PATENT DOCUMENTS

2015/0336271 A1* 11/2015 Spicer .................... B25J 9/1697
428/195.1

* cited by examiner

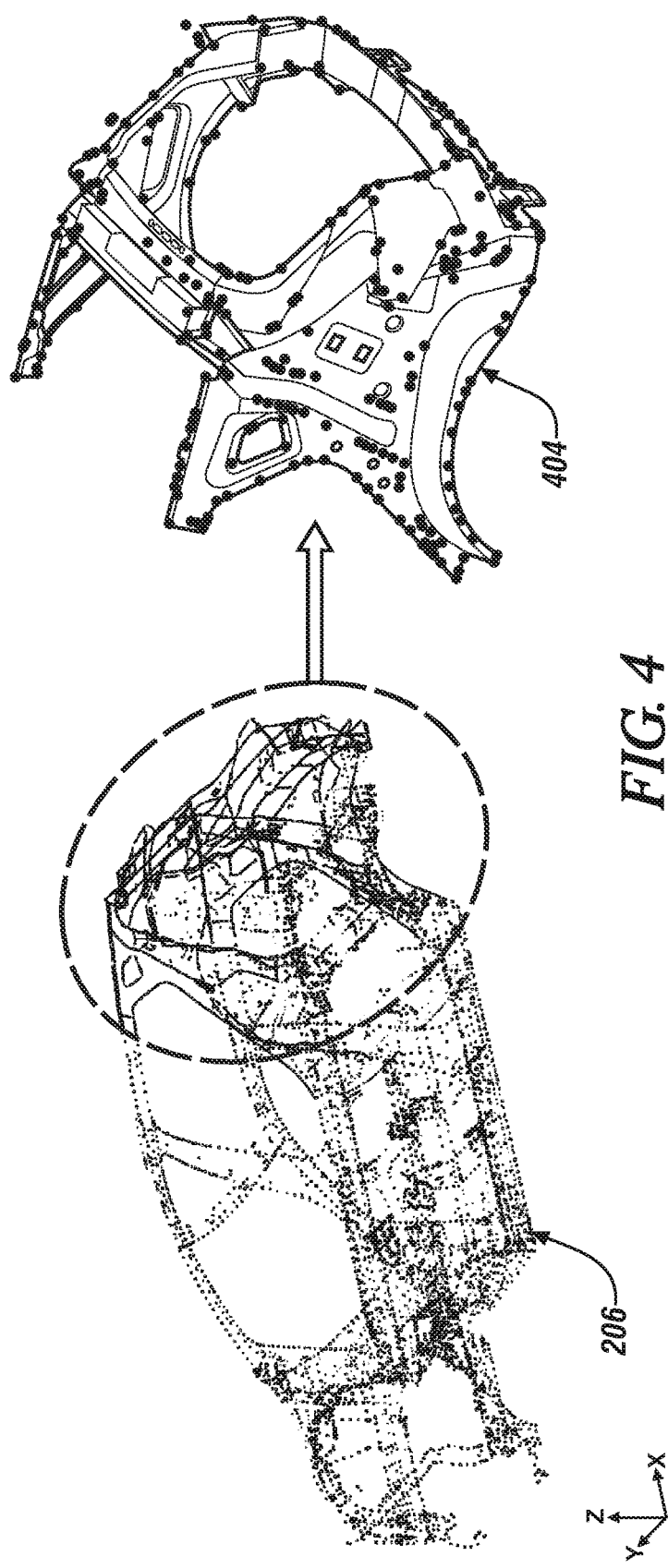

TOPOLOGY-BASED SPOT WELD OPTIMIZATION WITH INTER-DISTANCE CONSTRAINTS

INTRODUCTION

The subject disclosure relates to spot welding in automotive manufacturing, and more particularly, to topology-based spot weld optimization.

Spot welds are commonly used to join steel sheets in automotive structures. The number and layout of the spot welds are important for the performance of the structure. Reducing the number of spot welds provides clear benefits in the cost reduction for the manufacturing process, provided that structural and space requirements are met in the optimized product.

Conventional methods for weld optimization can require many man-hours to verify the optimized design. For example, in automotive and other manufacturing processes, any two spot welds require a minimum distance between welds (e.g., 20 mm) because of the space constraints and limitations of the welding fixtures and tool. Manufactured automobiles typically have many thousands of individual spot welds throughout the product. Many have attempted to solve the problem of minimizing weld points for spot welding at joints that adequately transfer the loads and meet other requirements. Conventional approaches for optimizing parameterized vehicle weld models have resulted in too many or too few spot welds. Moreover, the results of weld reduction systems must be observed and analyzed manually to verify that inter-distance and load transfer requirements have been met at each weld location. Verification includes analyzing a very large number of welds (e.g., 10,000 or more) in each section of the workpiece body. When contemplating the welds required for a full automotive body the number of required welds (and consequential calculations) can be many more.

Current state-of-art topology optimization techniques result in spot-weld clusters in a vehicle body, which must be observed and analyzed manually to verify that inter-distance requirements have been met at each weld location. Verification includes analyzing a very large number of welds in each section of the workpiece body. Other approaches using a Design of Experiment (DOE) based approach involve varying the minimum inter-distance (pitch distance) between spot-welds to reduce the total number of welds. The approach only tackles the appropriate pitch distance for a particular group of spot welds (weld lines) and not the problem of optimal location of spot-welds, and is not suitable for a large number of weld lines typically seen in a full vehicle body. Each of the calculations must be made and re-made after a change to a particular area of the vehicle, to ensure that minimum distance constraints are met and the transferred load between the welded workpiece(s) are sufficient.

Accordingly, it is desirable to provide a system for topology optimization that generates spot weld locations that meet inter-distance constraints while minimizing the total number of welds.

SUMMARY

In one exemplary embodiment, a computer-implemented method for reducing spot welds in a parameterized workpiece model includes generating, via a processor, a new design space (DS) from an original spot weld DS. The new DS includes a plurality of spot weld locations from the parameterized workpiece model with the original spot weld DS. The new DS is optimized to have a fewer number of spot weld locations than the original DS. The processor identifies a plurality of offending spot weld locations of the remaining spot weld locations in the new DS and a plurality of conforming spot weld locations of the remaining spot weld locations. The processor then removes the plurality of offending spot weld locations. Each of the plurality of the offending spot weld locations in the new DS are less than a predetermined minimum inter-distance from at least one of the remaining spot weld locations. The processor selects a plurality of extension candidates within a predetermined radius of each of the offending spot weld locations, then creates a grouping of the extension candidates within the predetermined inter-distance from any one of the spot weld locations in the new DS. The processor groups the extension candidates based on a candidate density factor. The processor next generates a plurality of extended DSs that each include a grouping of extension candidates that are within the predetermined inter-distance from any one of the spot weld locations in the new DS. The processor then removes all but one optimized extension candidate from each grouping. The processor outputs an inter-distance constrained parameterized workpiece model with an optimized extension candidate in each of the plurality of extended DSs to an operatively connected output processor.

In another exemplary embodiment a system for reducing spot welds in a parameterized workpiece model includes a processor. The processor is configured to generate a new design space (DS) including a plurality of spot weld locations from an original spot weld DS in the parameterized workpiece model. The new DS includes a plurality of spot weld locations from the parameterized workpiece model with the original spot weld DS. The new DS is optimized to have a fewer number of spot weld locations than the original DS. The processor identifies a plurality of offending spot weld locations of the remaining spot weld locations in the new DS and a plurality of conforming spot weld locations of the remaining spot weld locations. The processor then removes the plurality of offending spot weld locations. Each of the plurality of the offending spot weld locations in the new DS are less than a predetermined minimum inter-distance from at least one of the remaining spot weld locations. The processor selects a plurality of extension candidates within a predetermined radius of each of the offending spot weld locations, then creates a grouping of the extension candidates within the predetermined inter-distance from any one of the spot weld locations in the new DS. The processor groups the extension candidates based on a candidate density factor and generates a plurality of extended DSs that each include a grouping of extension candidates that are within the predetermined inter-distance from the any one of the spot weld locations in the new DS. The processor then removes all but one optimized extension candidate from each grouping. The processor outputs, to an operatively connected output processor, an inter-distance constrained parameterized workpiece model with an optimized extension candidate in each of the plurality of extended design spaces (DSs).

In another exemplary embodiment a computer program product for reducing spot welds in a parameterized workpiece model includes a computer readable storage medium. The storage medium includes program instructions executable by a processor to cause the processor to perform a method. The method includes generating, via the processor, a new design space (DS) from an original spot weld DS. The new DS includes a plurality of spot weld locations from the parameterized workpiece model with the original spot weld DS. The new DS is optimized to have a fewer number of spot weld locations than the original DS. The processor identifies a plurality of offending spot weld locations of the remaining spot weld locations in the new DS and a plurality of conforming spot weld locations of the remaining spot weld locations. The processor then removes the plurality of offending spot weld locations. Each of the plurality of the offending spot weld locations in the new DS are less than a predetermined minimum inter-distance from at least one of the remaining spot weld locations. The processor selects a plurality of extension candidates within a predetermined radius of each of the offending spot weld locations, then creates a grouping of the extension candidates within the predetermined inter-distance from any one of the spot weld locations in the new DS. The processor groups the extension candidates based on a candidate density factor and generates a plurality of extended DSs that each include a grouping of extension candidates that are within the predetermined inter-distance from the any one of the spot weld locations in the new DS. The processor then removes all but one optimized extension candidate from each grouping. The processor outputs, to an operatively connected output processor, an inter-distance constrained parameterized workpiece model with an optimized extension candidate in each of the plurality of extended DSs.

In another exemplary embodiment, the processor generates a new DS from the parameterized workpiece model by removing spot weld locations from the original DS. The new DS is optimized for structural performance and spot weld location minimization, but not optimized for inter-distance between the spot welds.

In another exemplary embodiment, generating the new DS from the parameterized workpiece model includes removing the spot weld locations without regard to a spot weld location inter-distance constraint indicative of a distance between any two of the spot weld locations in the new DS.

In another exemplary embodiment, selecting the plurality of extension candidates includes selecting all removed spot weld locations within a predetermined radius of each of the offending spot weld locations.

In another exemplary embodiment, after generating the grouping, the processor identifies the one extension candidate in each grouping based on a volume fraction for each of the extension candidates and the conforming spot weld location.

In another exemplary embodiment, the one identified extension candidate is identified by satisfying an approximated hyperbolic equation of a form $C_1 xy - x^2 - y^2 < C_2$, where $C_1$ is a corner sharpness constant, $C_2$ is a volume fraction constant, x is a volume fraction of an extension candidate, and y is a volume fraction of the conforming spot weld location.

The above features and advantages, and other features and advantages of the disclosure, are readily apparent from the following detailed description when taken in connection with the accompanying drawings.

BRIEF DESCRIPTION OF THE DRAWINGS

Other features, advantages and details appear, by way of example only, in the following detailed description, the detailed description referring to the drawings in which:

FIG. 4. is an optimization output of the system of FIG. 1, according to one embodiment.

DETAILED DESCRIPTION

Figure 1:
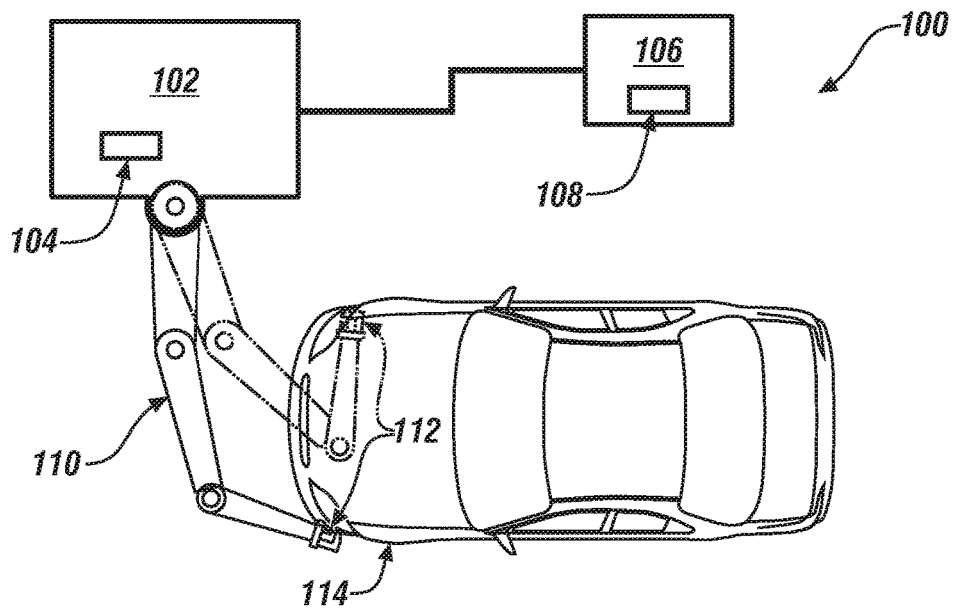
FIG. 1 is a system diagram for a topology-based spot weld optimization system, according to one embodiment.

The following description is merely exemplary in nature and is not intended to limit the present disclosure, its application or uses. It should be understood that throughout the drawings, corresponding reference numerals indicate like or corresponding parts and features. As used herein, the term module refers to processing circuitry that may include an application specific integrated circuit (ASIC), an electronic circuit, a processor (shared, dedicated, or group) and memory that executes one or more software or firmware programs, a combinational logic circuit, and/or other suitable components that provide the described functionality.

FIG. 1 is a system 100 for topology-based spot weld optimization in accordance with an exemplary embodiment. System 100 includes one or more automated tools 102 for spot welding a workpiece 114, depicted in the example of FIG. 1 as an automobile body. In some embodiments, system 100 includes a tool arm 110, and is controlled by a controller 106. Controller 106 includes one or more processors 108.

As shown in FIG. 1, automated tool 102 includes one or more tool arms 110 configured to perform spot welds in various spot weld locations 112 of workpiece 114. Automated tool 102 is configured to perform welds via one or more processors (e.g., processor 104) according to a program executed by the processor 104. The executed program is instantiated by processor 108 in tool controller 106, or created in another operatively connected computer and saved to a non-volatile computer memory in automated tool 102. In some aspects, the program executed by processor 104 is based on a parameterized model of workpiece 114 that includes a design space of the various spot weld locations.

Figure 2:
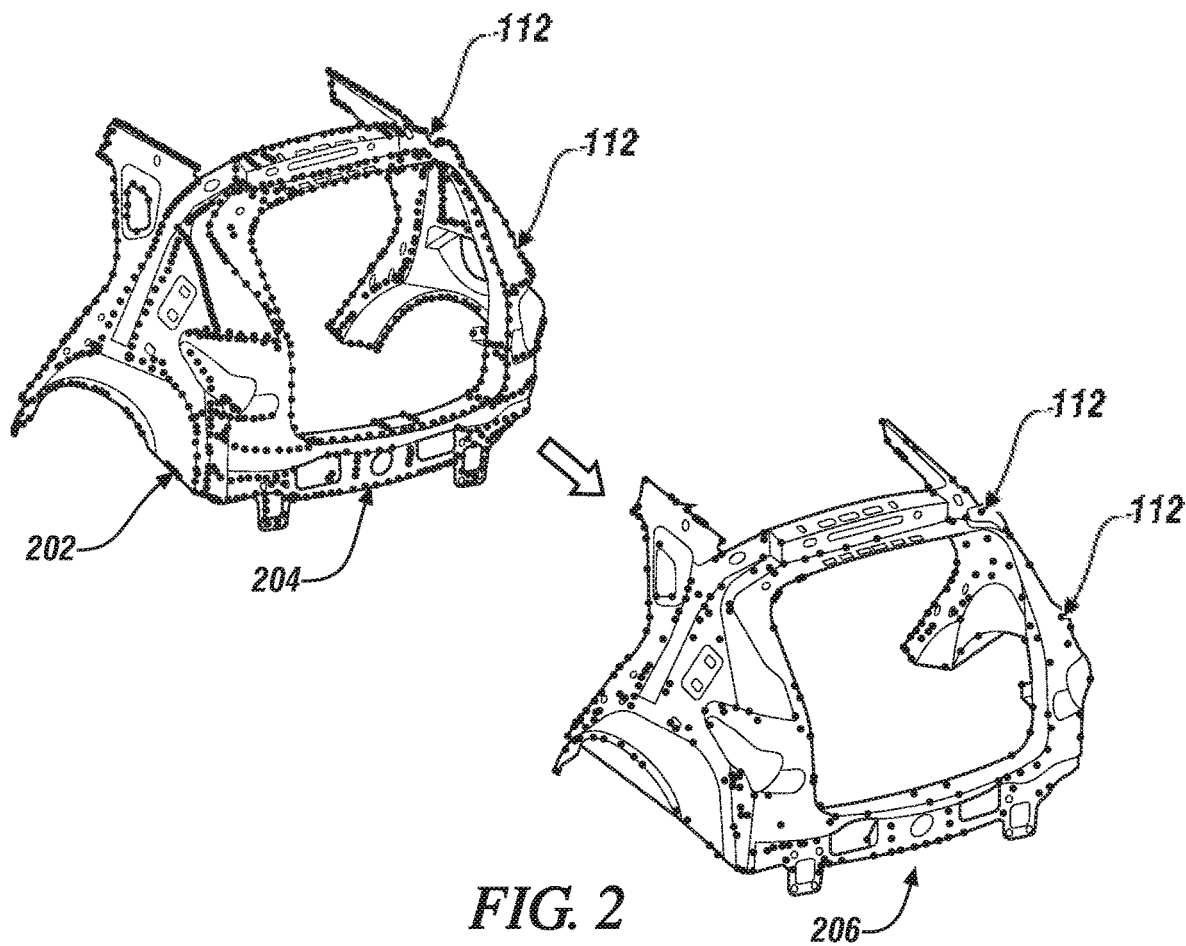
FIG. 2 is a depiction of spot welds on a portion of a vehicle, according to one embodiment.

FIG. 2 depicts a parameterized workpiece model 202 that includes a design space of spot weld locations (e.g., spot weld locations 112, as shown in FIG. 1). Considering FIGS. 1 and 2 together, in one embodiments of the present disclosure, processor 108 receives, as an input, the parameterized model depicted in FIG. 2, optimizes the locations of the spot weld locations 204 by strategically removing some locations that are unneeded, and outputs an optimized spot weld parameterized workpiece model 206. The optimized parameterized workpiece model 206 is now configured with a minimum number of weld locations to accomplish the design and functional goals of the workpiece 114 while maintaining inter distance constraints between the weld locations.

Figure 3:
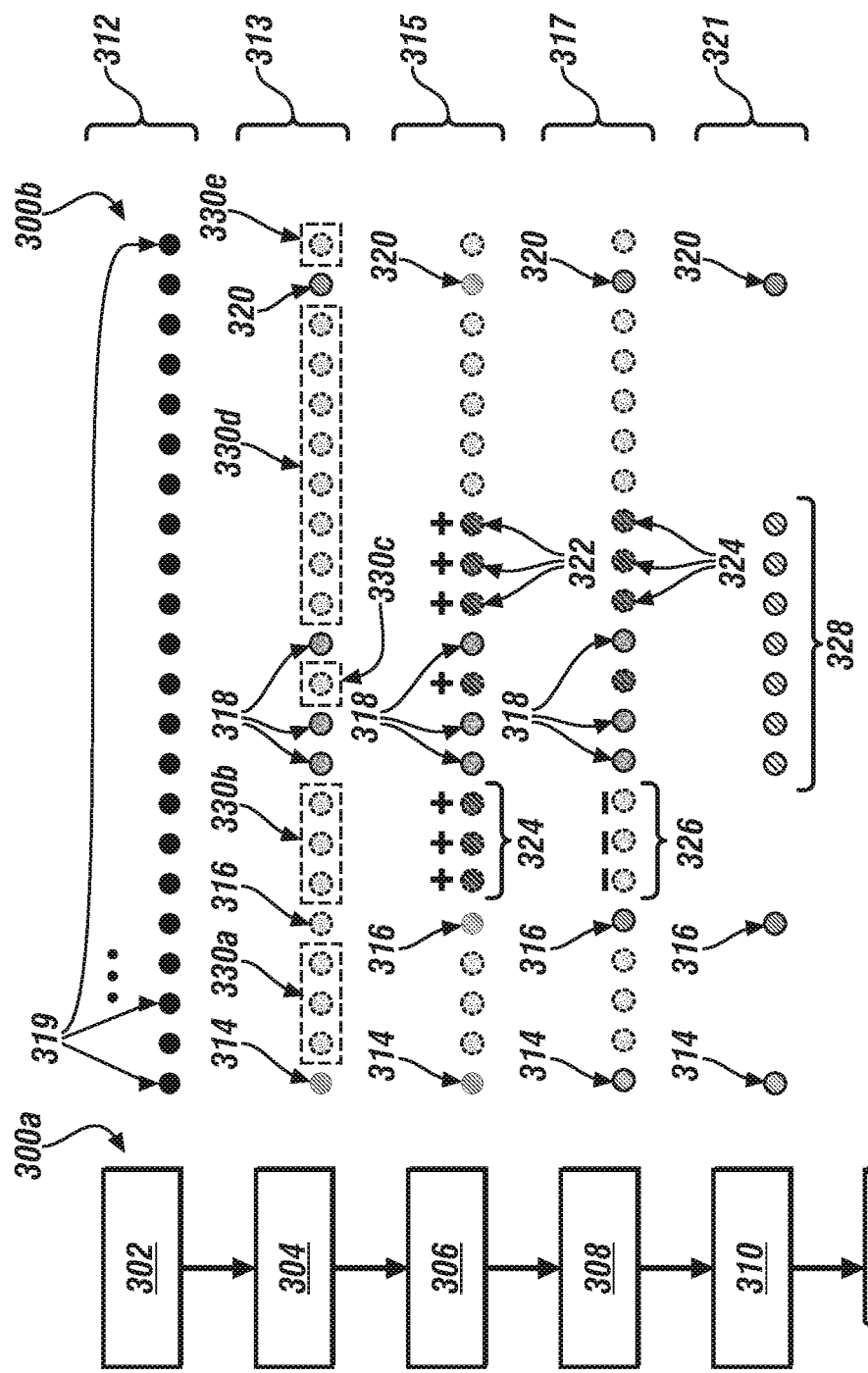
FIG. 3 is a flow diagram and exemplary output of a method for topology-based spot weld optimization using the system of FIG. 1, according to one embodiment.

FIG. 3 is a flow diagram of a computer-implemented method 300a for reducing spot welds in a parameterized workpiece model using the system of FIG. 1, according to one embodiment. An exemplary output 300b is shown in FIG. 3, where each of the steps 302, 304, 306, 308, 310, and 311, respectively, correspond to a demonstrative output shown to the right of some steps. FIGS. 2 and 3 are considered simultaneously.

In general, method 300a includes two main operations: a first step 302 that optimizes the number of spot weld locations to create a new design space (new DS) 312. The new DS has been optimized using any number of known optimization methods for reducing the overall number of spot weld locations. However the new DS 312 output by processor 108 at step 302 is not an optimized model that takes into consideration inter-distance constraints such as, for example, that each distance between any two spot weld locations must be at least 20 mm or some other predetermined constraint.

The second of the two main operations includes steps 304-311. During the second operation, processor 108 optimizes the new DS 312. New DS 312 is an optimization that does not include the minimum distance design constraint but does maintain structural and functional aspects of the workpiece that are required in the final product.

Now, considering method 300a in greater detail, according to one embodiment, processor 108 is configured to receive parameterized workpiece model 202 and generate a new design space (DS) that includes a plurality of spot weld locations from the parameterized workpiece model 202. The parameterized workpiece model 202 includes an original spot weld DS (exemplified in FIG. 2 where each spot weld location 204 is shown as a dot on the parameterized workpiece model 202).

At step 302, processor 108 performs a preliminary optimization (without distance constraints) that results in a plurality of retained spot weld locations 319. Spot weld locations 319 are configured by processor 108 to satisfy inter-distance constraints that are greater than a predetermined distance (for example, 20 mm). In some aspects, some of the original spot weld locations are removed from the original parameterized workpiece model 202. Processor 108 outputs the new DS 312, which is optimized to have a fewer number of spot weld locations than the original DS in parameterized model 202.

At step 304, processor 108 identifies a plurality of offending spot weld locations of the remaining spot weld locations in the new DS 312. An offending spot weld location is one or more spot weld locations (e.g., 330a, 330b, 330c, etc.) that do not meet the predetermined minimum inter-distance between any two of the spot weld locations 319. In some aspects, processor 108 generates the new DS 312 from the parameterized workpiece model 202 by removing spot weld locations from the original DS, where the new DS is optimized for structural performance and spot weld location minimization, but not optimized for inter-distance between the spot weld locations 319. Accordingly, generating the new DS 312 from the parameterized workpiece model 202 includes removing the spot weld locations without regard to a spot weld location inter-distance constraint indicative of a distance between any two of the spot weld locations in the new DS 312.

For example, if the inter-distance constraint is set to be 20 mm, one or more welds are removed by processor 108 between two offending locations 330a, 330b, 330c, 330d, 330e . . . etc., until both of the inter-distance constraints are maintained and the strength and/or other properties are satisfied respective to the remaining weld locations. Processor 108 then removes one or more of the plurality of offending spot weld locations 330a-330e, where each of the plurality of the offending spot weld locations in the new DS are less than a predetermined minimum inter-distance from at least one of the remaining spot weld locations 314, 316, 318, and 320. After step 304, processor 108 leaves the new DS 313 (after step 306) having a reduced number of weld spots that meet the predetermined inter-distance constraint.

At step 306, processor 107 selects a plurality of extension candidates (for example, 322 and 324) within a predetermined radius of each of the offending spot weld locations, resulting in new DS 315. An extension candidate is a spot weld location within the predetermined inter-distance constraint (e.g., within a 20 mm radius). Selecting the plurality of extension candidates includes selecting all removed spot weld locations within a predetermined radius of each of the offending spot weld locations. For example, offending spot weld locations 330b, which were removed in step 304, are shown in new DS 316 as selected by processor 108, because they are within a predetermined radius of the spot weld location 316 in new DS 313. But the offending spot weld location 330c, which was removed in step 304, is shown in new DS 315 as unselected by processor 108 as an extension candidate (and not part of spot weld locations 318). Similarly, extension candidates 322 are selected by the processor 108, because they are within the predetermined radius of one or more of the spot welds depicted as offending spot weld locations 330d (shown in new DS 313). Processor 108 selects the extension candidates 322 and 324 based on one or more candidate density factors. The candidate density factor is used by the processor 108 to determine which of the removed offending spot welds (e.g., spot welds 330b and 330d in new DS 313) gets added back in within the radius for the extended DS 315 (e.g., weld locations 322, 324, etc.).

According to some embodiments, processor 108 performs step 306 by first searching for topo-welds (e.g., extension candidates 322) within the predetermined radius inter-distance (e.g., 20 mm) of a given topographical weld location. Processor 108 then writes out constraints with the selected extension candidates. For example, the constraints use the volume fraction of individual topo-welds as design variables for optimization. The volume fraction is representation of the amount of weld material in a spot-weld with a value of zero implying the location is empty and has no material whereas a value of one implies that the location is filled completely with weld material. In another aspect, the one identified extension candidate is identified by satisfying an approximated hyperbolic equation of the form $C_1xy-x^2-y^2<C_2$, where $C_1$ is a determinant of the sharpness of the corner of the hyperbola (nearing the origin) and is typically greater than a value of 3, $C_2$ is a volume fraction constant, x is a volume fraction of an extension candidate (e.g., one of extension candidates 322), and y is a volume fraction of the conforming spot weld location (e.g., one or more of conforming spot weld locations 314, 316, 320, etc.).

At step 308, processor 108 generates a plurality of extended DSs each including a grouping of extension candidates (e.g., 326 is grouped with 318 and 324) that are within the predetermined inter-distance from the any one of the spot weld locations (e.g., spot weld location 316) in the new DS 317.

At step 310, processor 108 removes all but one optimized extension candidate from each grouping (e.g., the processor 108 leaves in extended DS 326 only weld spot location 316, and the processor 108 leaves only the spot weld location 320 in extended DS 328), resulting in new DS 321. The new DS 321 now only includes the optimized spot weld locations 314, 316, and 320. Spot weld locations 328 are removed by the processor 108 by the optimization process.

At step 311, processor 108 outputs, to an operatively connected output processor 104, an inter-distance constrained parameterized workpiece (for example, model 206) with an optimized extension candidate in each of the plurality of extended DSs 326, 328, etc. Using the parameterized workpiece model 206, the processor 104 can produce an improved workpiece 114 having a minimized number of weld locations 112 while maintaining the inter-distance constraint between weld locations. In some aspects, outputting the inter-distance constrained parameterized workpiece model includes optimizing the spot weld locations to have the predetermined minimum inter-distance between spot welds.

FIG. 4, considered in conjunction with FIG. 1, is an exemplary optimization output of the system 100 of FIG. 1, according to one embodiment. As shown in FIG. 4, processor 108 takes in the inter-distance constrained parameterized workpiece model 206, and causes automated tool 102 to run the weld optimized program. Workpiece portion 404 is shown having a reduced number of weld locations. For example, a reduction of 5-1000 spot weld locations may be realized while maintaining the inter-distance constraint requirements.

While the above disclosure has been described with reference to exemplary embodiments, it will be understood by those skilled in the art that various changes may be made and equivalents may be substituted for elements thereof without departing from its scope. In addition, many modifications may be made to adapt a particular situation or material to the teachings of the disclosure without departing from the essential scope thereof. Therefore, it is intended that the present disclosure not be limited to the particular embodiments disclosed, but will include all embodiments falling within the scope thereof.

What is claimed is:

1. A computer-implemented method for reducing spot welding a workpiece comprising:
   providing an automated tool comprising a first processor and configured to spot weld the workpiece based upon a program executed by the first processor;
   providing a second processor;
   receiving, at the second processor, a parameterized workpiece model having an original spot weld design space (DS) comprising a respective plurality of spot weld locations corresponding to the workpiece;
   generating, via the second processor, a second spot weld DS comprising a respective plurality of spot weld locations, wherein the second spot weld DS is optimized to have fewer spot weld locations than the original spot weld DS;
   identifying, via the second processor, a plurality of offending spot weld locations of the remaining spot weld locations in the second spot weld DS and a plurality of conforming spot weld locations of the remaining spot weld locations in the second spot weld DS, and removing the plurality of offending spot weld locations from the second spot weld DS leaving a third spot weld DS comprising a respective plurality of spot weld locations having fewer spot weld locations than the second spot weld DS, wherein each of the plurality of offending spot weld locations in the second spot weld DS are less than a predetermined inter-distance from at least one of the remaining spot weld locations in the third spot weld DS;
   selecting, via the second processor, a plurality of extension candidates within a predetermined radius of each of the offending spot weld locations;
   creating, via the second processor, a grouping of the extension candidates within the predetermined inter-distance from any one of the spot weld locations in the third spot weld DS, the grouping based on a candidate density factor and comprising a fourth spot weld DS comprising a respective plurality of spot weld locations having more spot weld locations than the third spot weld DS;
   generating, via the second processor a plurality of extended DSs each comprising a grouping of extension candidates that are within the predetermined inter-distance from the any one of the spot weld locations in the fourth spot weld DS, and removing all but one optimized extension candidate from each grouping leaving a fifth spot weld DS comprising a respective plurality of spot weld locations, wherein the one extension candidate from each grouping is identified based on a volume fraction for each of the extension candidates and the conforming spot weld location;
   outputting, via the second processor, to the first processor, the fifth spot weld DS comprising an inter-distance constrained parameterized workpiece model with an optimized extension candidate in each of the plurality of extended DSs, and
   executing, by the first processor, the program to spot weld the workpiece, the program comprising the respective plurality of spot weld locations of the fifth spot weld DS, whereby the workpiece is spot welded at a minimum number of weld locations consistent with the predetermined inter-distance.

2. The computer-implemented method of claim 1, wherein the second spot weld DS is generated from the parameterized workpiece model by removing spot weld locations from the original spot weld DS; and
   wherein the second spot weld DS is optimized for structural performance and spot weld location minimization, but not optimized for inter-distance between the spot welds.

3. The computer-implemented method of claim 2, wherein generating the second spot weld DS from the parameterized workpiece model comprises removing the spot weld locations without regard to a spot weld location inter-distance constraint indicative of a distance between any two of the spot weld locations in the second spot weld DS.

4. The computer-implemented method of claim 1, wherein selecting the plurality of extension candidates comprises selecting all removed spot weld locations within a predetermined radius of each of the offending spot weld locations.

5. The computer-implemented method of claim 1, wherein the one identified extension candidate is identified by satisfying an approximated hyperbolic equation of a form $C_1 xy - x^2 - y^2 < C_2$;
   wherein $C_1$ is a corner sharpness constant, $C_2$ is a volume fraction constant, x is a volume fraction of an extension candidate, and y is a volume fraction of the conforming spot weld location.

6. A system for spot welding a workpiece comprising:
   an automated tool comprising a first processor and configured to spot weld the workpiece based upon a program executed by the first processor;
   a second processor configured to:
   receive a parameterized workpiece model having an original spot weld design space (DS) comprising a respective plurality of spot weld locations corresponding to the workpiece;
   generate a second spot weld design space DS comprising a respective plurality of spot weld locations, wherein the second spot weld DS is optimized to have fewer spot weld locations than the original spot weld DS;
   identify a plurality of offending spot weld locations of the remaining spot weld locations in the second spot weld DS and a plurality of conforming spot weld locations of the remaining spot weld locations in the second spot weld DS, and remove the plurality of offending spot weld locations from the second spot weld DS leaving a third spot weld DS comprising a respective plurality of spot weld locations having fewer spot weld locations than the second spot weld DS, wherein each of the plurality of the offending spot weld locations in the second spot weld DS are less than a predetermined inter-distance from at least one of the remaining spot weld locations in the third spot weld DS;

select a plurality of extension candidates within a predetermined radius of each of the offending spot weld locations;

create a grouping of the extension candidates within the predetermined inter-distance from any one of the spot weld locations in the third spot weld DS, the grouping based on a candidate density factor and comprising a fourth spot weld DS comprising a respective plurality of spot weld locations having more spot weld locations than the third spot weld DS;

generate a plurality of extended DSs each comprising a grouping of extension candidates that are within the predetermined inter-distance from the any one of the spot weld locations in the fourth spot weld DS, and remove all but one optimized extension candidate from each grouping leaving a fifth spot weld DS comprising a respective plurality of spot weld locations, wherein the one extension candidate from each grouping is identified based on a volume fraction for each of the extension candidates and the conforming spot weld location; and output, to the first processor, the fifth spot weld DS comprising an inter-distance constrained parameterized workpiece model with an optimized extension candidate in each of the plurality of extended DSs, and the first processor executing the program to spot weld the workpiece, the program comprising the respective plurality of spot weld locations of the fifth spot weld DS, whereby the workpiece is spot welded at a minimum number of weld locations consistent with the predetermined inter-distance.

7. The system of claim 6, wherein the second spot weld DS is generated from the parameterized workpiece model by removing spot weld locations from the original spot weld DS; and wherein the second spot weld DS is optimized for structural performance and spot weld location minimization, but not optimized for inter-distance between the spot welds.

8. The system of claim 7, wherein generating the second spot weld DS from the parameterized workpiece model comprises removing the spot weld locations without regard to a spot weld location inter-distance constraint indicative of a distance between any two of the spot weld locations in the second spot weld DS.

9. The system of claim 6, wherein selecting the plurality of extension candidates comprises selecting all removed spot weld locations within a predetermined radius of each of the offending spot weld locations.

10. The system of claim 6, wherein the one identified extension candidate is identified by satisfying an approximated hyperbolic equation of a form $C_1 xy - x^2 - y^2 < C_2$;

wherein $C_1$ is a corner sharpness constant, $C_2$ is a volume fraction constant, x is a volume fraction of an extension candidate, and y is a volume fraction of the conforming spot weld location.

* * * * *